(12) United States Patent
Barbera et al.

(10) Patent No.: US 7,836,365 B2
(45) Date of Patent: *Nov. 16, 2010

(54) SYSTEM AND METHOD FOR TESTING A CIRCUIT

(75) Inventors: George E. Barbera, Phoenix, AZ (US); David C. Crohn, Coto de Caza, CA (US)

(73) Assignee: Broadcom Corporation, Irvine, CA (US)

( * ) Notice: Subject to any disclaimer, the term of this patent is extended or adjusted under 35 U.S.C. 154(b) by 976 days.

This patent is subject to a terminal disclaimer.

(21) Appl. No.: 11/132,673

(22) Filed: May 19, 2005

(65) Prior Publication Data

US 2005/0216807 A1     Sep. 29, 2005

Related U.S. Application Data

(63) Continuation of application No. 10/187,116, filed on Jun. 28, 2002, now Pat. No. 6,968,488.

(60) Provisional application No. 60/361,004, filed on Mar. 1, 2002.

(51) Int. Cl.
    *G01R 31/28* (2006.01)

(52) U.S. Cl. ............... 714/726; 714/30; 714/727; 714/728

(58) Field of Classification Search ............ 714/726, 714/30, 727, 729; *G01R 31/3177, 31/3181, G01R 31/8135*
See application file for complete search history.

(56) References Cited

U.S. PATENT DOCUMENTS

| | | | | |
|---|---|---|---|---|
| 5,329,167 A | * | 7/1994 | Farwell | 327/199 |
| 5,642,364 A | | 6/1997 | Farwell | |
| 5,767,717 A | * | 6/1998 | Schorn et al. | 327/210 |
| 5,848,075 A | | 12/1998 | Katayama et al. | |
| 5,886,901 A | | 3/1999 | Magoshi | |
| 5,887,004 A | * | 3/1999 | Walther | 714/726 |
| 6,240,536 B1 | * | 5/2001 | Mikan et al. | 714/727 |
| 6,272,654 B1 | * | 8/2001 | Freiburger | 714/724 |
| 6,377,098 B1 | * | 4/2002 | Rebeor | 327/210 |
| 6,389,566 B1 | * | 5/2002 | Wagner et al. | 714/726 |
| 6,708,303 B1 | | 3/2004 | Gallia | |
| 6,775,116 B2 | * | 8/2004 | Nuber et al. | 361/54 |
| 6,968,488 B2 | * | 11/2005 | Barbera et al. | 714/726 |
| 2001/0052096 A1 | | 12/2001 | Huijbregts | |
| 2003/0093733 A1 | | 5/2003 | Zhang | |
| 2003/0200493 A1 | | 10/2003 | Campbell | |
| 2004/0003330 A1 | | 1/2004 | Block et al. | |
| 2004/0250185 A1 | | 12/2004 | Date | |

FOREIGN PATENT DOCUMENTS

| | | | |
|---|---|---|---|
| EP | 0444 826 A2 | 9/1991 | |
| EP | 0822 419 A | 2/1998 | |

\* cited by examiner

*Primary Examiner*—Sam Rizk
(74) *Attorney, Agent, or Firm*—McAndrews, Held & Malloy, Ltd.

(57) ABSTRACT

Systems and methods for testing a circuit are provided. In one example, a sequential device for use in a scan chain is described. The sequential device may include a scan input, a scan output and a functional data output. The functional data output may be coupled to the scan input and to the scan output. The functional data output may be coupled to the scan output via a delay buffer.

22 Claims, 8 Drawing Sheets

SYSTEM AND METHOD FOR TESTING A CIRCUIT

RELATED APPLICATIONS

This application is a continuation of U.S. patent application Ser. No. 10/187,116, entitled "System and Method for Testing a Circuit," filed Jun. 28, 2002, now U.S. Pat. No. 6,968,488, which claims priority to and claims benefit from U.S. Provisional Patent Application Ser. No. 60/361,004, entitled "Slow Scan Output," filed on Mar. 1, 2002.

INCORPORATION BY REFERENCE

The above-referenced United States patent applications are hereby incorporated herein by reference in their entirety.

BACKGROUND OF THE INVENTION

The above-referenced United States patent applications are hereby incorporated herein by reference in their entirety.

After a very large scale integrated circuit (VLSIC) has been designed and optimized in simulation according to particular specifications, an actual circuit is tested to ensure that there are no defects (e.g., physical defects, component defects, circuital defects, etc.) in the VLSIC.

A conventional scan chain provides a system and a method for testing for defects in, for example, sequential devices and combinational logic circuits of the VLSIC. In a conventional scan chain, the sequential devices (e.g., flip flops or flops) of the VLSIC are connected into a serial chain as shown, in part, in FIG. 1. The VLSIC includes sequential devices 10, 20 and combinational logic circuits 30. The conventional scan chain system consists of many flops, however only two of the flops are shown for illustration. A first flop 10 and a second flop 20 have inputs and outputs. In the illustrated example, each flop 10, 20 has a data input DI, a scan input SI, a clock input CLK and a data output DO. The data input DI is connected to combinational logic circuit 30 of the VLSIC. The clock input CLK is connected to a clock of the VLSIC (not shown). The data output DO is connected to the combinational logic circuit 30.

In addition, the data output DO of the first flop 10 is also connected to a buffer 40 via a first wire 50. The buffer 40 is connected to the scan input SI of the second flop 20 via a second wire 60. The scan input SI of the first flop 10 is connected such that it receives the scan output signal from the data output DO of the previous flop (not shown) in the serial chain via a buffer (not shown) and two wires (not shown). The data output DO of the second flop 20 is also connected to the next flop (not shown) in the serial chain via a buffer (not shown) and two wires (not shown) such that the next flop receives the scan output signal from the second flop 20.

In operation, an input test vector is scanned through the serial chain of flops. The input test vector is a known set of zeroes and ones. The input test vector is scanned in serially one bit at a time through the serial chain. The scan path in the illustrated example passes through the scan input SI of the first flop 10, the data output DO of the first flop, the first wire 50, the buffer 40, the second wire 60, the scan input SI of the second flop 20, the data output DO of the second flop and so on. The buffer 40 provides a needed time delay between the data output DO of the first flop 10 and the scan input SI of the second flop 20 so that the second flop 20 can function properly. The time delay is needed, for example, to avoid hold time violations or other time violations from occurring in the second flop 20. When a time violation occurs, the output of the flop is not necessarily known for a given input. Such time delays have become more prominent in scan chain design as technologies become smaller and faster.

Once the entire input test vector has been scanned (i.e., shifted) into the serial chain such that each flop of the serial chain has its associated value from the input test vector, the data input signals to the flops are loaded in parallel via the data inputs DI of the flops. The input signals to the flops may be a function of at least one of the combinational logic circuit 30 and the values on the data outputs DO of the flops. The data input signals then pass to the data outputs DO of the flops. The data outputs DO then are scanned out or shifted out to form another set of zeroes and ones known as an output test vector. The output test vector can then be compared with the expected test vector to determine whether a defect occurs in the VLSIC. The expected test vector may have been generated from a simulation program.

This conventional example may have one or more of the following disadvantages. For example, before the testing, the VLSIC was already designed and optimized to satisfy the particular specifications. However, in order to make the scan chain, changes in the VLSIC must be made which may push the performance of the VLSIC out of compliance with the specifications. For example, to perform the scan chain, a buffer needs to be inserted near the first flop 10 and the second flop 20. Furthermore, two wires 50, 60 need to be added to connect the buffer 40 to the flops 10, 20. Combinational logic circuits may need to be rearranged and wires will need to be broken and rewired to avoid the buffers and the additional two wires per buffer.

In addition, the timing of the VLSIC may be altered by the scan chain. For example, buffers may be placed where space is available in the VLSIC, but far away from the flops they serve. Thus, a substantial amount of delay may be added to the timing of the circuit which may cause the circuit to malfunction. In addition, if the buffers are spaced far away from the flops, then this can cause unwanted wiring complexities in the VLSIC to accommodate the buffer wiring. The timing of the flops is also affected by the scan chain. For example, the data output DO of the first flop 10 is loaded by at least the additional wire 50 and the buffer 40 which will affect the first flop 10 during functional operation.

The effects of making the scan chain are magnified significantly in light of the fact that a VLSIC may contain hundreds of thousands or millions of flops. This can be very frustrating for a design engineer since before making the scan chain, most of the value had already been invested in the design and the optimizing of the design of the VLSIC. Then, merely to test the physical circuit for defects via a scan chain, the design had to be significantly revised to accommodate the additional buffers and the two wires associated with each buffer.

A cycle results in connecting the scan chain, followed by fixing the design which was broken by adding the scan chain, which may lead to reconnecting the scan chain broken by the fixes, followed by fixing the design again and so on. This cycle may add a lot of time and require a lot of resources to complete a VLSIC, which previous to testing may have functioned effectively. The time added may be dependent upon the complexity of the design and may be on the order of days, weeks or months.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Aspects of the present invention may be found in, for example, systems and methods that test a circuit. In one embodiment, the present invention may provide a sequential device for use in a scan chain. The sequential device may include, for example, a scan input, a scan output and a functional data output coupled to the scan input and to the scan output. The functional data output may be coupled to the scan output via a delay buffer.

In another embodiment, the present invention may provide a system for testing a circuit. The system may include, for example, a first flop and a second flop. Each of the first flop and the second flop may include a scan input, a delay buffer, a scan output and a data output. The data output may be coupled to the scan input and to the scan output. The data output may be coupled to the scan output via the delay buffer. The scan output of the first flop is coupled directly to the scan input of the second flop via an interconnect.

In yet another embodiment, the present invention may provide a method for testing a circuit using a scan chain. The method may include the steps of connecting sequential devices in a serial chain, each of the sequential devices having a dedicated scan output that is isolated from a functional data output; shifting an input test vector into the serial chain via the dedicated scan outputs of the sequential devices; loading functional data inputs of the sequential devices; carrying the loaded functional data inputs on the functional data outputs and the dedicated scan outputs of the sequential devices; and shifting an output test vector out of the serial chain via the dedicated scan outputs of the sequential devices.

These and other features and advantages of the present invention may be appreciated from a review of the following detailed description of the present invention, along with the accompanying figures in which like reference numerals refer to like parts throughout.

DETAILED DESCRIPTION OF THE INVENTION

Figure 2:
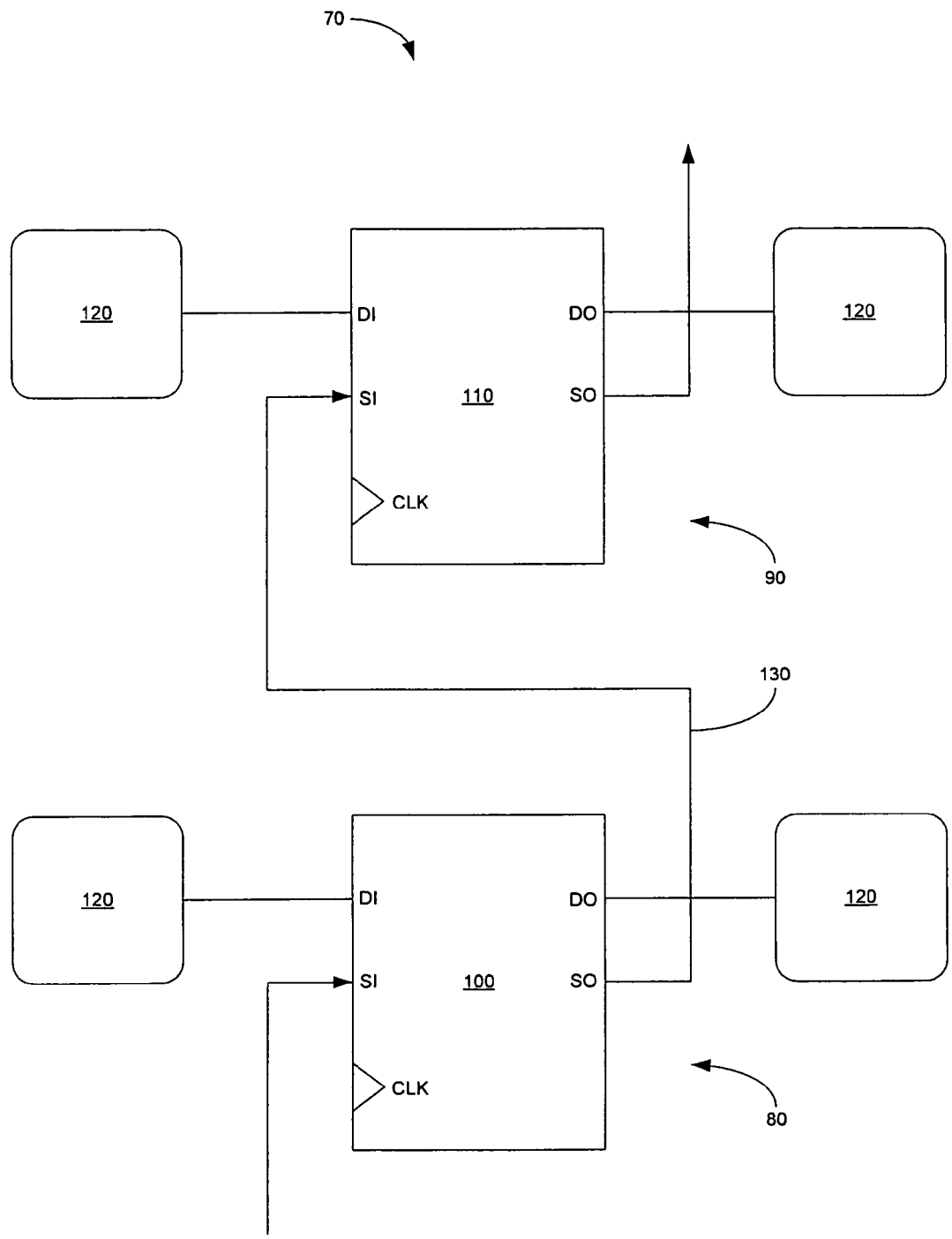
FIG. 2 shows an example of a scan chain according to the present invention.

FIG. 2 shows a block diagram illustrating an example of a scan chain 70 according to the present invention. The scan chain 70 may provide a system and a method that can be used to test a circuit such as, for example, a very large scale integrated circuit (VLSIC) or other types of circuits. In one example, the scan chain 70 may provide high fault coverage testing. In another example, the scan chain 70 may test for defects in one or more of the sequential devices or in one or more of the combinational logic circuits or portions thereof in the VLSIC. The scan chain 70 may include one or more sequential devices of the VLSIC that are connected into a serial chain as shown, in part, in FIG. 2. A sequential device may include, for example, any type of flip flop (i.e., flop) or sets of flops or other types of sequential devices. The VLSIC may include, for example, sequential devices 80, 90 and combinational logic circuits 30. In one example, the sequential devices 80, 90 include flops 100, 110, respectively. The scan chain 70 may include one or more flops, however, only two of the flops 100, 110 are illustrated in FIG. 2. A first flop 100 and a second flop 110 may include inputs and outputs. Some of the inputs and outputs of a flop known to one of ordinary skill in the art may not be shown here.

The first flop 100 and the second flop 110, each may include a data input DI, a scan input SI, a clock input CLK, a data output DO and a scan output SO. The data input DI may be connected to combinational logic circuit 120 of the VLSIC. The clock input CLK may be connected to a clock of the VLSIC (not shown). The present invention also contemplates that the clock inputs CLK of some flops may be connected to different clocks of the VLSIC. The data output DO may be connected to the combinational logic circuit 120. Although FIG. 2 may show the combinational logic circuit 120 as four separate modules, the modules may overlap and share circuitry.

The scan output SO of the first flop 100 is connected to the scan input SI of the second flop 110 via a wire 130. In one example, a single wire connects the scan input SI of the second flop 110 and the scan output SO of the first flop 100. In another example, the scan output SO of the first flop 100 is directly connected to the scan input SI of the second flop 110 via the wire 130. The scan input SI of the first flop 100 is connected such that it receives the scan output signal from the scan output SO of the previous flop (not shown) in the serial chain via a wire. The scan output SO of the second flop 110 is connected to the scan input SI of the next flop (not shown) in the serial chain via a wire such that the next flop receives the scan output signal from the second flop 110.

In operation, an input test vector is scanned through the serial chain of flops. The input test vector is a known set of values (e.g., binary zeroes and ones). In one example, the length of the input test vector is related (e.g., equal) to the length of the serial chain of flops. The input test vector is scanned in serially one bit at a time through the serial chain. In one example, during scanning, each of the flops processes the input signal from the scan input SI instead of from the data input DI. The input signal from the scan input SI or the data input DI may subsequently be carried by the scan output SO and the data output DO, the scan output SO possibly carrying the signal after a time delay. The scan path in the example shown in FIG. 2 passes through the scan input SI of the first flop 100, the scan output SO of the first flop 100, the wire 130, the scan input SI of the second flop 110, the scan output SO of the second flop and so on.

Once the entire input test vector has been scanned (i.e., shifted) into the serial chain such that, for example, each flop of the serial chain is carrying its associated value on its data output DO and its scan output SO, the data input signals to the flops are loaded in parallel via the data inputs DI of the flops. In one example, when the data input signals to the flops are being loaded into the flops via the data inputs DI, input signals are not being loaded into the flops via the scan inputs SI. The data input signals to the flops may be a function of at least one of the combinational logic circuit 120 and the data outputs DO of the flops. The data input signals from the data inputs DI then pass to the data outputs DO of the flops and, possibly after a time delay, the scan outputs SO of the flops. The scan outputs SO then are scanned out or shifted out to form another set of, for example, zeroes and ones known as an output test vector. The output test vector can then be compared with the expected test vector to determine whether a defect occurs in the VLSIC. The expected test vector may have been generated from a circuit simulation program.

Other input test vectors can be scanned into the scan chain 70 to test other portions of the combinational logic circuit 120. In one example, as the output test vector is being scanned out of the scan chain 70, the next input test vector can be scanned into the scan chain 70. A plurality of scan chains may be used to split up the VLSIC into regions that can be tested in parallel. The number of input test vectors used to test a VLSIC may be a function of, for example, the complexity of the VLSIC, the size of the VLSIC or the amount of fault coverage desired. The values of the input test vectors and the number of input test vectors can be determined by a scan chain simulation program which is known to one of ordinary skill in the art.

Some embodiments of the present invention may have one or more of the following advantages. For example, since the interconnect between the two flops has been reduced from a buffer and two wires to a single wire, the breaking of existing interconnects in the VLSIC is minimized. The breaking of existing interconnects was particularly problematic in conventional schemes in which a buffer could not be inserted near the two flops and thus required two long wires which increased the risk of breaking existing interconnects in the VLSIC. However, without having to insert a buffer and two additional wires (e.g., possibly long wires), two close flops can be connected with a short wire, for example, to minimize the risk of breaking existing interconnects and of being drawn into cycles of fixing broken interconnects, redesigning and testing. 321 In addition, some embodiments of the present invention may provide two different outputs: a scan output SO that is different and isolated from the data output DO. Thus, the data output DO is not loaded by the scan chain. In the conventional example, the data output DO of the flop was connected to the scan input SI of another flop via two wires and a buffer. Thus, the data output DO carried an additional load besides its function load (e.g., the combinational logic circuit 30). Such loading may cause driving and timing problems, which might require cycles of fixing broken interconnects, redesigning and testing. However, some embodiments of the present invention provide for a direct connection from a scan output SO, which is isolated from the data output DO, of one flop to the scan input SI of another flop. Thus, the scan outputs SO and the scan chain interconnects are isolated from the data outputs DO, and therefore do not load the data outputs DO.

Figure 3:
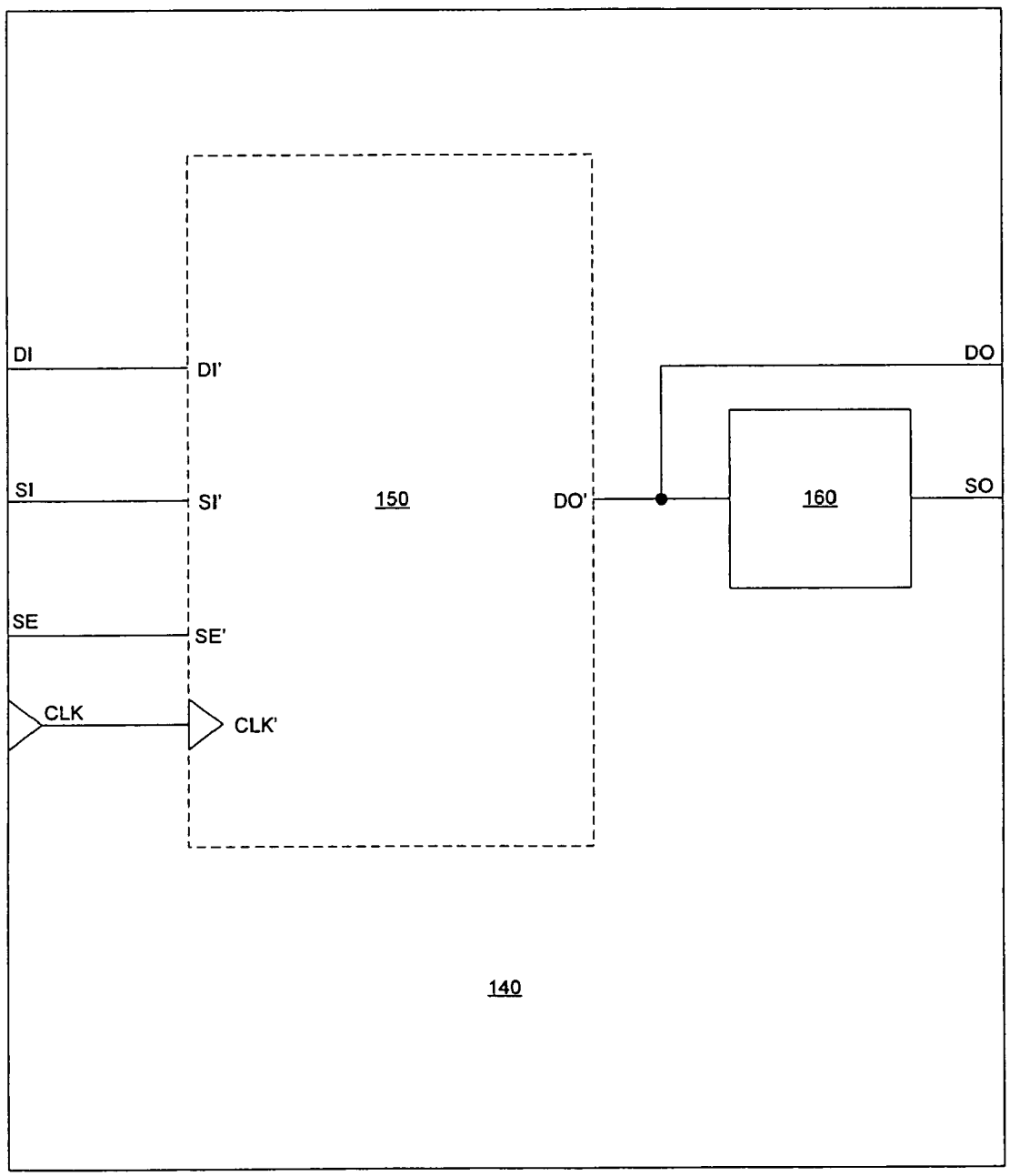
FIG. 3 shows an example of a sequential device according to the present invention.

FIG. 3 shows an example of a flop 140 according to the present invention. Although the flop 140 may be shown as a flop of a particular kind, the present invention may provide other kinds of flops or sequential devices. The flop 140 may include a conventional flop 150 and a delay buffer 160. The flop 140 may include inputs and outputs such as, for example, the data input DI, the scan input SI, a scan enable input SE, the clock input CLK, the data output DO and the scan output SO. The conventional flop 150 may include, for example, one of the flops shown in FIG. 1 or any other conventional flop or conventional portion thereof known to one of ordinary skill in the art. The conventional flop 150 does not necessarily represent a separate conventional flop 150 mounted inside the flop 140, but may represent circuitry known to one of ordinary skill in the art as being part of a conventional flop. The conventional flop 150 is shown with inputs and an output such as, for example, a data input DI', a scan input SI', a scan enable input SE', a clock input CLK' and a data output DO'. The flop 140 and the conventional flop 150 may include other inputs and outputs which are not shown here, but are known to one of ordinary skill in the art.

The delay buffer 160 is structured to provide a time delay. The delay buffer 160 may also provide a buffer so that the data output DO is isolated from the scan output SO. In one example, the data output DO is not loaded by the scan output SO because of the isolation provided by the delay buffer 160. As shown in FIG. 3, the inputs and output of the conventional flop 150 are connected to corresponding inputs and output of the flop 140. Thus, the data input DI is connected to the data input DI'; the scan input SI is connected to the scan input SI'; the scan enable input SE is connected to the scan enable input SE'; the clock input CLK is connected to the clock input CLK'; and the data output DO is connected to the data output DO'. In addition, the data output DO' of the conventional flop 150 is also connected to an input of the delay buffer 160. An output of the delay buffer 160 is connected to the scan output SO of the flop 140.

In one example, a two-to-one multiplexor or selector may be used in which the data input DI and the scan input SI are connected to the inputs of the multiplexor or selector and the scan enable input SE is connected to the selector input of the multiplexor or selector. Thus, the signal carried by the scan enable input SE would determine which of the inputs (i.e., the scan input SI or the data input DI) would be passed onto the output of the multiplexor or selector.

In operation, when the input test vector is being scanned into the scan chain 70, the scan enable input SE may be enabled by a scan enable input signal. When the scan enable input SE receives an enabling signal, then the flop 140 and the conventional flop 150 may be in a scan mode or a shift mode. Thus, the scan inputs SI, SI' are enabled and the signals carried by the scan inputs SI, SI' are passed on to the outputs DO', DO and SO. In one example, when the scan enable input SE receives an enabling signal, the data inputs DI, DI' may be disabled such that the signals carried by the data inputs DI, DI' are not passed on to the outputs DO', DO and SO. The scan output SO may receive its signal via the delay buffer 160 after a buffered delay. The time delay may be, for example, a preset delay or a designed delay. The input test vector may be shifted through the scan chain with each clock signal. Thus, the scan output SO may provide the signal to the scan input SI of the next flop 140 in the scan chain 70.

When the scan enable input SE receives a disabling signal, then the flop 140 and the conventional flop are in a functional mode. Thus, the data inputs DI, DI' are enabled and the signals carried by the data inputs DI, DI' are passed on to the outputs DO', DO and SO. In one example, when the scan enable input SE receives a disabling signal, the scan inputs SI, SI' may be disabled such that the signals carried by the scan inputs SI, SI' are not passed on to the outputs DO', DO and SO. The scan output SO may receive its signal via the delay buffer 160 after a buffered delay. In one example, all of the flops in the scan chain 70 may load their inputs on the same clock signal (i.e., in parallel or substantially concurrently). The output of the flop 140 appears on both the data output DO and the scan output SO. After loading the data inputs, the output signals of the flops in the scan chain 70 represent the reaction of the VLSIC to the input test vector. In one example, after loading the data inputs, the output signals of the flops in the scan chain 70 represent the reaction of the combinational logic circuit 120 to the input test vector.

The output signals on the scan outputs SO can then be scanned out via an enabling signal received by the scan enabling inputs SI which may cause the flops to go into a scan mode or a shift mode as described above. The output signals on the scan outputs SO, which are shifted out of the VLSIC, may form a set of values (e.g., a string of binary zeroes and ones) which is known as an output test vector. In one example, as the output test vector is scanned out of the scan chain 70, another input test vector may be scanned in at the same time. Thus, an output test vector can be generated for each input test vector scanned into the scan chain 70. The output test vector can then be compared with the expected test vector to see whether or not a defect exists in the VLSIC.

Figure 4:
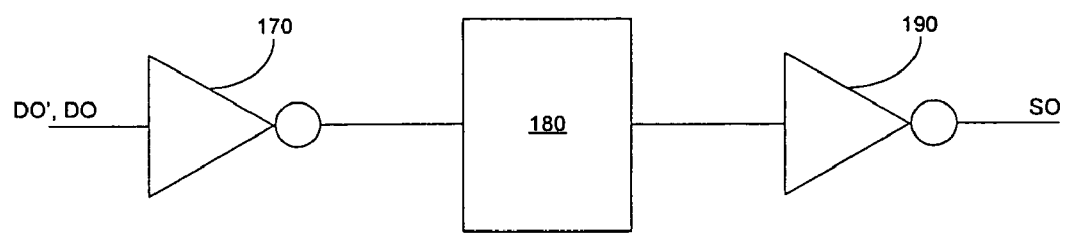
FIG. 4 shows an example of a delay buffer according to the present invention.

FIG. 4 shows a representation of an example of the delay buffer 160 according to the present invention. The delay buffer 160 may include, for example, a first inverter 170, a time delay unit 180 and, optionally, a second inverter 190. The input of the first inverter 170 is connected to at least one of the data outputs DO', DO. The first inverter 170 is connected to the time delay unit 180 which, in turn, is connected to the second inverter 190. The output of the second inverter 190 is connected to the scan output SO of the flop 140. The first inverter 170 may be structured to invert its input signal and to provide isolation between the data outputs DO', DO and the scan output SO. The time delay unit 180 may include, for example, a transmission gate or other time delay circuitry. The time delay unit 180 may provide a time delay so that the sequential devices avoid timing violations such as, for example, set up time violations, clock transition time violations or hold time violations. The second inverter 190 may be structured to invert the signal which may have been inverted by the first inverter 170.

Figure 5:
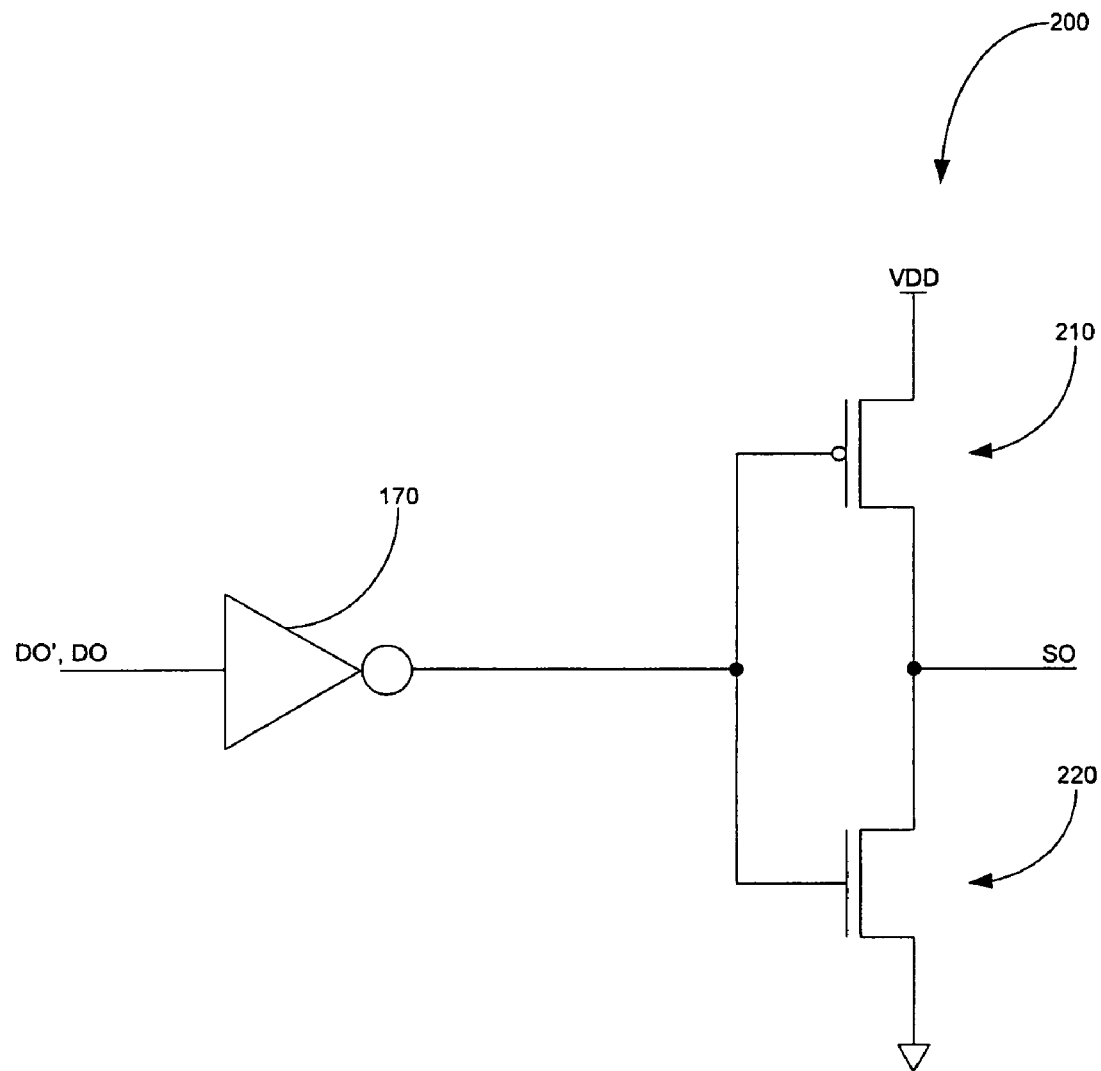
FIG. 5 shows an example of a delay buffer according to the present invention.

FIG. 5 shows a representation of another example of the delay buffer 160 according to the present invention. The delay buffer 160 may include, for example, the inverter 170 and a complementary metal oxide semiconductor (CMOS) transistor arrangement 200. The CMOS transistor arrangement 200 may include at least one p-channel MOS (PMOS) transistor 210 and at least one n-channel MOS (NMOS) transistor 220 configured in a CMOS scheme. The input of the inverter 170 is connected to at least one of the data outputs DO', DO. An output of the inverter 170 is connected to an input of the CMOS transistor arrangement 200. An output of the CMOS transistor arrangement 200 is connected to the scan output SO of the flop 140. The inverter 170 may be structured to invert its input signal and to provide isolation between the data outputs DO', DO and the scan output SO. The CMOS transistors 210, 220 may be structured to provide delay by providing poor drive strength. For example, poor drive strength may be achieved by making the width of the CMOS transistors 210, 220 short and the length of the CMOS transistors 210, 220 long. Thus, by connecting an interconnect to the scan output SO, a capacitive load including, for example, interconnect metal and any gate load, that is driven by the CMOS transistor arrangement 200 may provide a substantial delay.

Figure 6:
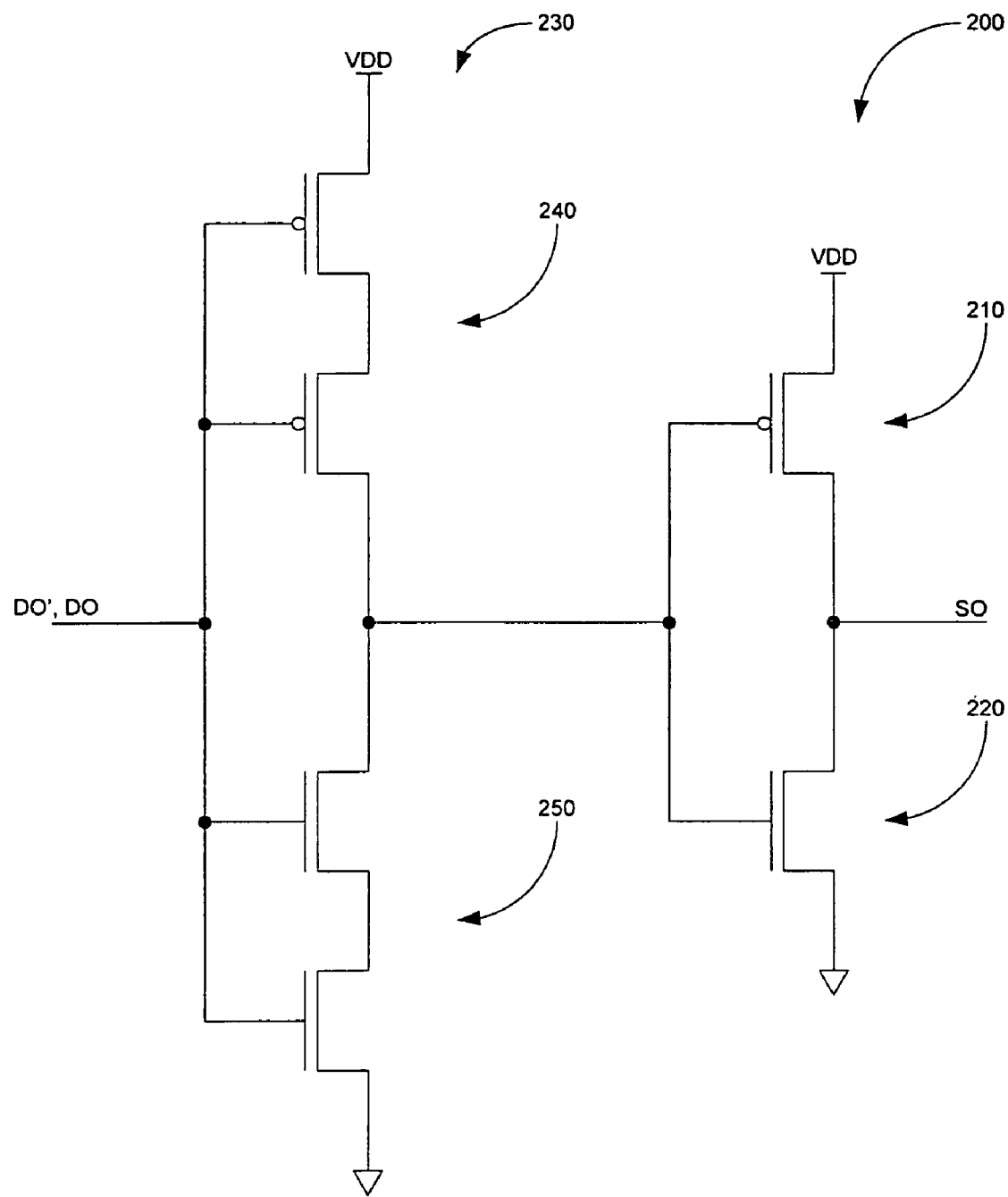
FIG. 6 shows an example of a delay buffer according to the present invention.

FIG. 6 shows a representation of another example of the delay buffer 160 according to the present invention. The delay buffer 160 may include, for example, a first CMOS transistor arrangement 230 and a second CMOS transistor arrangement 200. The CMOS transistor arrangements 200, 230 may include at least one PMOS transistor 210 and at least one NMOS transistor 220 configured in a CMOS scheme. In the illustrated example, the first CMOS transistor arrangement 230 includes two PMOS transistors 240 and two NMOS transistors 250. The first CMOS transistor arrangement 230 is configured as a conventional totem pole configuration. Although shown as a four transistor totem pole, the present invention may contemplate using more transistors in the totem pole. The input of the first CMOS transistor arrangement 230 is connected to at least one of the data outputs DO', DO. An output of the first CMOS transistor arrangement 230 is connected to an input of the second CMOS transistor arrangement 200. An output of the second CMOS transistor arrangement 200 is connected to the scan output SO of the flop 140.

The first CMOS transistor arrangement 230 may be structured to invert its input signal and to provide isolation between the data outputs DO', DO and the scan output SO. The first CMOS arrangement 230 may be structured to provide a high intrinsic delay (even without much loading). In one example, the intrinsic delay is high enough to ensure that, even with a light load, any time violations (e.g., a hold time violation) are prevented. The CMOS transistors 210, 220, 240, 250 may be structured to provide delay by providing poor drive strength. For example, poor drive strength may be achieved by making the width of the CMOS transistors 210, 220, 240, 250 short and the length of the CMOS transistors 210, 220, 240, 250 long. Thus, by connecting an interconnect to the scan output SO, a capacitive load that is driven by the CMOS transistor arrangements 200, 230 may provide a substantial delay. In addition, the first CMOS transistor arrangement 230 may weaken the drive strength of the second CMOS transistor arrangement 200, thereby providing for greater delay. The totem pole configuration used in the first CMOS transistor arrangement 230 may be more effective at adding delay to the delay buffer 160. For example, two weak PMOS transistors are approximately twice as weak as a single weak PMOS transistor. Since the totem pole configuration provides for a weaker CMOS transistor arrangement, the delay may be increased because of the longer time it takes to drive, for example, a particular capacitive load. In one example, the totem pole configuration may provide a high intrinsic delay (even without much loading).

Figure 7:
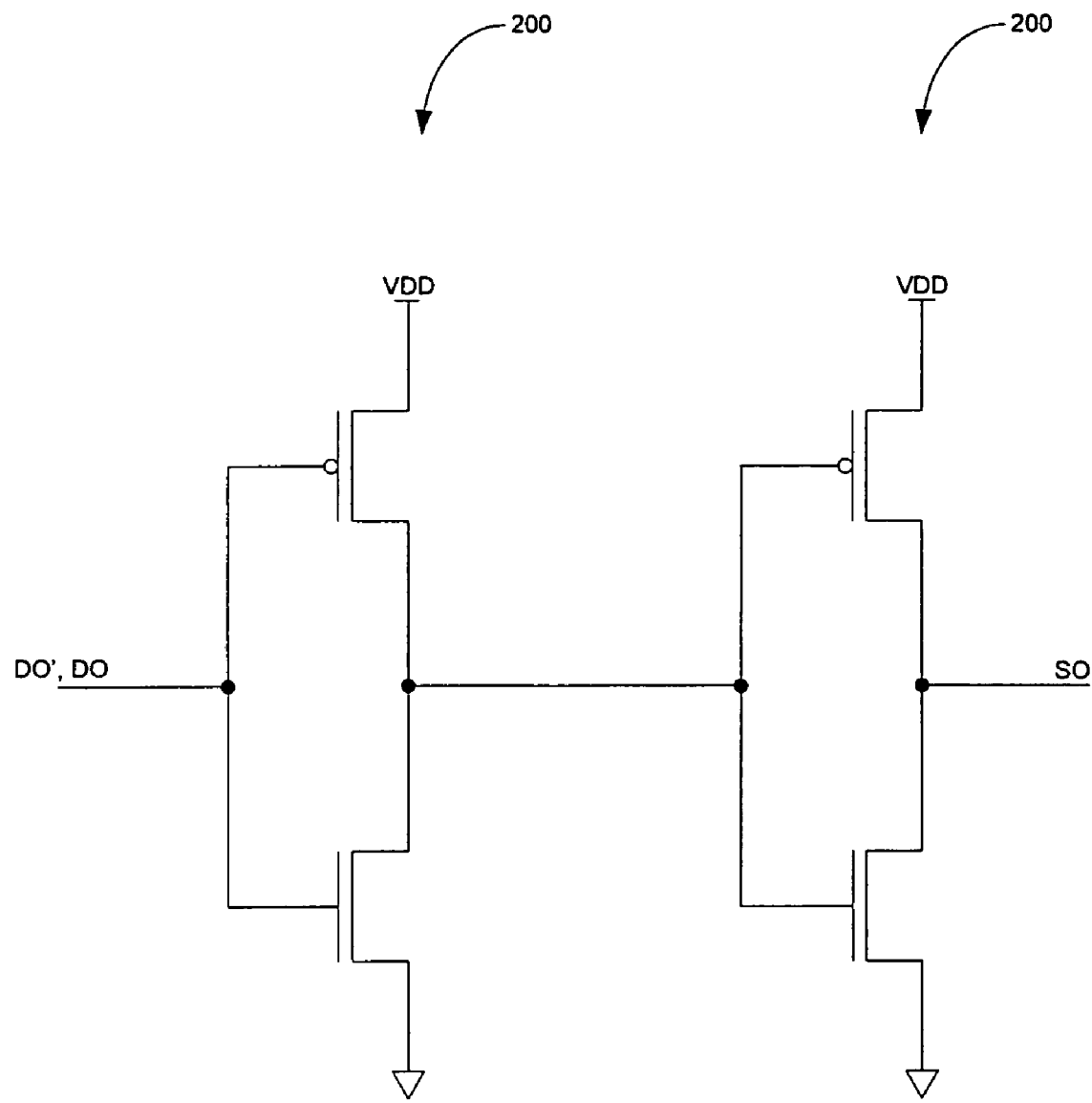
FIG. 7 shows an example of a delay buffer according to the present invention.
Figure 8:
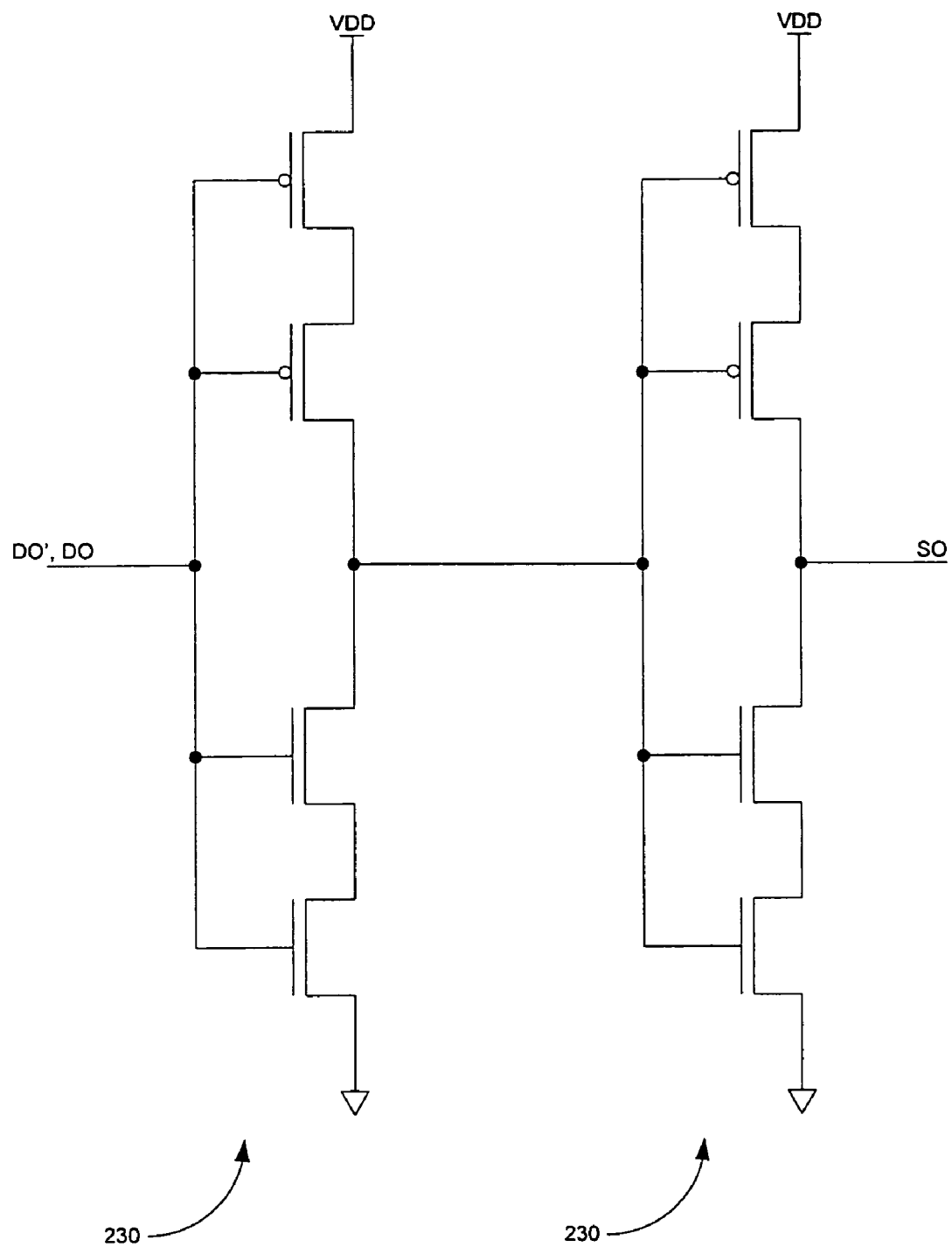
FIG. 8 shows an example of a delay buffer according to the present invention.

FIG. 7 and FIG. 8 show representations of other examples of the delay buffer 160 according to the present invention. In FIG. 7, two CMOS transistor arrangements 200 are used. In FIG. 8, two CMOS transistor arrangements 230 are used in which the two CMOS transistor arrangements 230 are configured in a totem pole configuration. These examples operate in a similar manner as has been described above. The selection of a particular example for a particular use may be a function of, for example, the desired size of the flop 140 and the desired amount of time delay.

Figure 1:
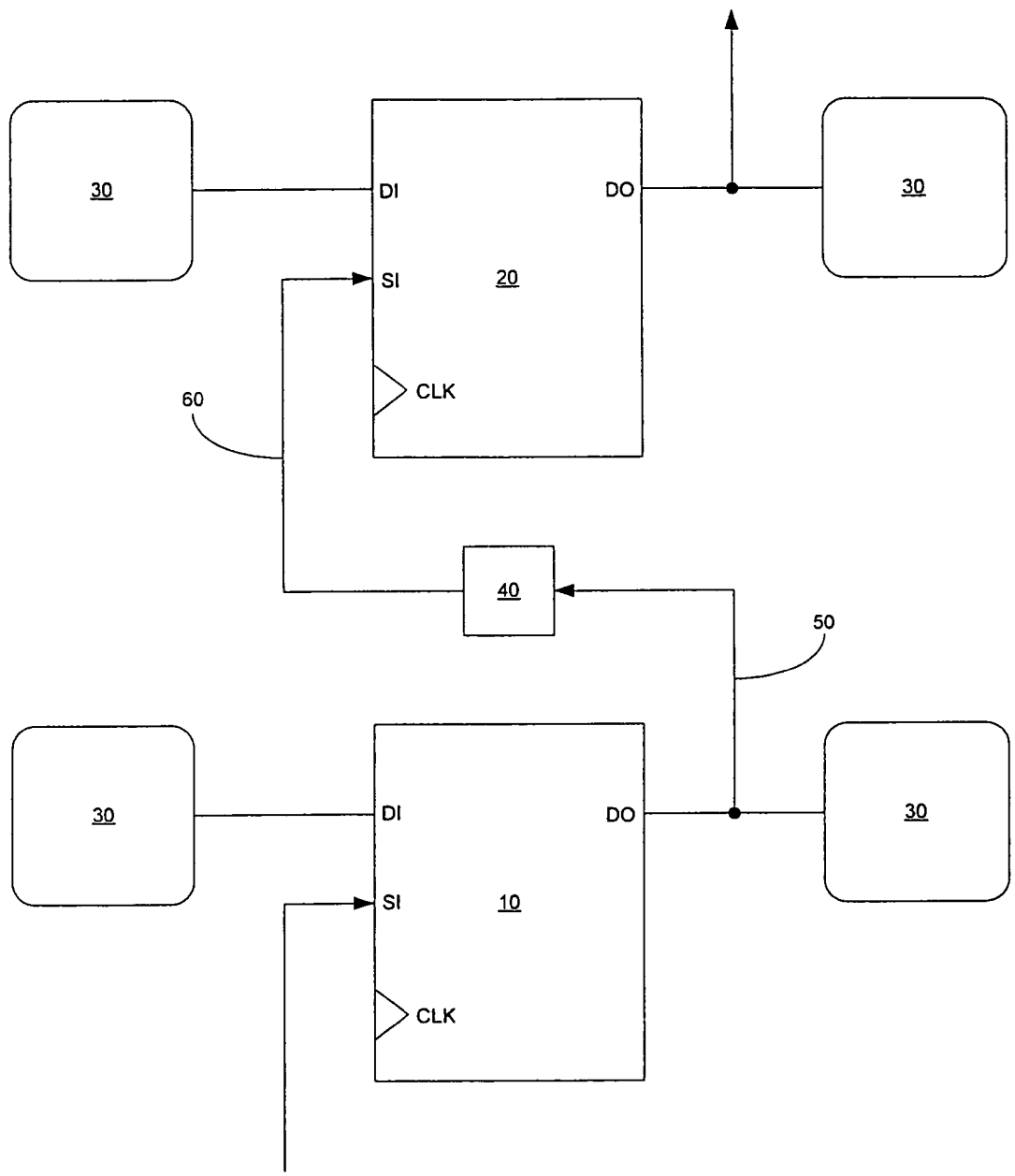
FIG. 1 shows an example of a conventional scan chain.

In some of the examples described herein, the overall area taken up by the flop 140 including the delay buffer 160 may be equal to or less than the overall area taken up by the conventional flop 10, 20 and the buffer 40 as illustrated in FIG. 1.

Also, although examples described herein may place the delay buffer 160 at or near the scan output SO, the delay buffer 160 may be placed at or near the scan input SI within the flop 140, thereby providing for a slow scan input. In addition, a combination of delay buffers 160 or a combination of portions thereof may be employed at the scan output SO and the scan input SI according to the present invention, thereby providing for a combination of a slow scan input and a slow scan output.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present inven-

What is claimed is:

1. A sequential device for use in a scan chain, comprising:
   a scan input;
   a scan output; and
   a functional data output communicatively coupled to the scan input and to the scan output, the functional data output being communicatively coupled to the scan output via a delay buffer,
   wherein the delay buffer comprises a first inverter, characterized by a first asynchronous transistor arrangement, in series with a second inverter characterized by a second asynchronous transistor arrangement different from the first asynchronous transistor arrangement.

2. The sequential device of claim 1, wherein the delay buffer is structured to isolate the scan output from the functional data output.

3. The sequential device of claim 1, wherein the delay buffer is structured to provide a desired amount of time delay.

4. The sequential device of claim 3, wherein the delay buffer is structured to provide a desired amount of time delay by, at least in part, being structured to weaken the drive strength of one or more components of the delay buffer.

5. The sequential device of claim 4, wherein at least one transistor component of the delay buffer is structured with a relatively small width and relatively long length so as to exhibit relatively low drive strength.

6. The sequential device of claim 3, wherein the delay buffer is structured to provide a desired amount of time delay by, at least in part, being structured to provide a relatively high intrinsic delay.

7. The sequential device of claim 6, wherein the delay buffer is structured to provide a relatively high intrinsic delay by, at least in part, being structured to provide an intrinsic delay that is high enough to ensure that even with a relatively light load, time violations are prevented.

8. The sequential device of claim 3, wherein the desired amount of time delay is based, at least in part, on amount of time delay necessary to avoid at least one of: hold time violations and set-up time violations.

9. The sequential device of claim 1, wherein the functional data output is communicatively coupled to the scan input via at least one of: a multiplexer and a selector circuit.

10. The sequential device of claim 9, wherein the at least one of: a multiplexer and a selector circuit is controlled by a scan enable signal.

11. The sequential device of claim 1, further comprising circuitry adapted to disable a data input in response to receiving a scan enable signal.

12. The sequential device of claim 1, further comprising circuitry adapted to disable a scan input in response to receiving a scan disabling signal.

13. The sequential device of claim 1, wherein the functional data output is communicatively coupled to the scan input via a second delay buffer.

14. A system for testing a circuit, comprising:
   a first flop comprising a first scan input, a first delay buffer, a first scan output and a first data output, the first data output being communicatively coupled to the first scan input and to the first scan output, the first data output being communicatively coupled to the first scan output via the first delay buffer; and
   a second flop comprising a second scan input, a second delay buffer, a second scan output and a second data output, the second data output being communicatively coupled to the second scan input and to the second scan output, the second data output being communicatively coupled to the second scan output via the second delay buffer, the second scan input being coupled directly to the first scan output via an interconnect,
   wherein one or both of the first delay buffer and/or the second delay buffer comprises a first inverter, characterized by a first asynchronous transistor arrangement, in series with a second inverter characterized by a second asynchronous transistor arrangement different from the first asynchronous transistor arrangement.

15. The system of claim 14, wherein the first delay buffer is structured to provide a desired amount of time delay.

16. The system of claim 15, wherein the first delay buffer is structured to provide a desired amount of time delay by, at least in part, being structured to weaken the drive strength of one or more components of the first delay buffer.

17. The system of claim 15, wherein the first delay buffer is structured to provide a desired amount of time delay by, at least in part, being structured to provide a relatively high intrinsic delay.

18. The system of claim 14, wherein the first flop comprises a third delay buffer through which the first data output is communicatively coupled to the first scan input.

19. A method for testing a circuit using a scan chain, comprising of:
   connecting sequential devices in a serial chain, each of the sequential devices having a dedicated scan output that is isolated from a functional data output through at least a delay buffer, wherein the delay buffer comprises a first inverter, characterized by a first asynchronous transistor arrangement, in series with a second inverter characterized by a second asynchronous transistor arrangement different from the first asynchronous transistor arrangement;
   shifting an input test vector into the serial chain via the dedicated scan outputs of the sequential devices;
   loading functional data inputs of the sequential devices;
   carrying the loaded functional data inputs on the functional data outputs and the dedicated scan outputs of the sequential devices; and
   shifting an output test vector out of the serial chain via the dedicated scan outputs of the sequential devices.

20. The method of claim 19, wherein the first delay buffer is structured to provide a desired amount of time delay.

21. The method of claim 20, wherein the first delay buffer is structured to provide a desired amount of time delay by, at least in part, being structured to weaken the drive strength of one or more components of the first delay buffer.

22. The method of claim 20, wherein the first delay buffer is structured to provide a desired amount of time delay by, at least in part, being structured to provide a relatively high intrinsic delay.

* * * * *

UNITED STATES PATENT AND TRADEMARK OFFICE
CERTIFICATE OF CORRECTION

PATENT NO. : 7,836,365 B2  
APPLICATION NO. : 11/132673  
DATED : November 16, 2010  
INVENTOR(S) : Barbera et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 975 days.

Signed and Sealed this
Fourth Day of October, 2011

David J. Kappos
*Director of the United States Patent and Trademark Office*